United States Patent
Lim et al.

(10) Patent No.: US 12,490,602 B2
(45) Date of Patent: Dec. 2, 2025

(54) DISPLAY DEVICE WITH MORE COMPACT LIGHT SENSOR

(71) Applicant: LG Display Co., Ltd., Seoul (KR)

(72) Inventors: YoungNam Lim, Paju-si (KR); KwanSoo Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 503 days.

(21) Appl. No.: 18/058,236

(22) Filed: Nov. 22, 2022

(65) Prior Publication Data

US 2023/0209921 A1   Jun. 29, 2023

(30) Foreign Application Priority Data

Dec. 27, 2021   (KR) .................. 10-2021-0188034

(51) Int. Cl.
| | |
|---|---|
| *H10K 59/13* | (2023.01) |
| *H10K 59/80* | (2023.01) |
| *H10K 59/88* | (2023.01) |
| *H10K 85/50* | (2023.01) |
| *H10K 102/00* | (2023.01) |

(52) U.S. Cl.
CPC ......... *H10K 59/13* (2023.02); *H10K 59/8051* (2023.02); *H10K 59/8052* (2023.02); *H10K 59/88* (2023.02); *H10K 85/50* (2023.02); *H10K 2102/3026* (2023.02)

(58) Field of Classification Search
CPC ............... H10K 59/13; H10K 59/8051; H10K 59/8052; H10K 59/88; H10K 85/50; H10K 2102/3026; H10K 39/34; H10K 59/80518; H10K 59/121; H10K 65/00; H10K 30/10; H10K 30/30; H10K 59/131; H10K 59/35; G09F 9/335
See application file for complete search history.

(56) References Cited

U.S. PATENT DOCUMENTS

| | | | |
|---|---|---|---|
| 2012/0187394 A1 | 7/2012 | Hatano et al. | |
| 2021/0158751 A1 | 5/2021 | Cha et al. | |
| 2021/0167144 A1* | 6/2021 | Lim | ................ H10K 59/875 |

FOREIGN PATENT DOCUMENTS

| | | |
|---|---|---|
| JP | 2020053523 A | 4/2020 |
| KR | 20130033278 A | 4/2013 |
| KR | 20130068865 A | 6/2013 |
| KR | 20180009022 A | 1/2018 |
| KR | 20200072928 A | 6/2020 |
| KR | 20200080484 A | 7/2020 |
| KR | 20210064483 A | 6/2021 |
| KR | 20210069776 A | 6/2021 |

\* cited by examiner

*Primary Examiner* — Donald L Raleigh
(74) *Attorney, Agent, or Firm* — Seed Intellectual Property Law Group LLP

(57) ABSTRACT

A display device is provided, which includes a light sensor in a display panel. The display device comprises a substrate having a unit pixel area and a unit light sensor area, a first electrode over the substrate, a second electrode over the first electrode, a third electrode over the second electrode, a light emitting layer in the unit pixel area and disposed between the first electrode and the second electrode, and a light active layer disposed in the unit light sensor area and disposed between the second electrode and the third electrode.

20 Claims, 13 Drawing Sheets

DISPLAY DEVICE WITH MORE COMPACT LIGHT SENSOR

BACKGROUND

Technical Field

The present disclosure relates to a display device comprising a light sensor.

Description of the Related Art

A display device includes various display elements such as a liquid crystal display element or an organic light emitting element in a display area. Since a light sensor is embedded in the display device, a method capable of applying a variety of applications by interconnecting the display area with the light sensor has been devised.

In the display device, a hole may be formed to mount the light sensor, and the light sensor may be disposed in the hole. In this case, since an image is not displayed in an area where the hole is formed, the image displayed in the display device may be disconnected and recognized by a user. Also, since the image is not displayed as much as the area in which the hole is formed, a size of the display area in the display device may be reduced.

In addition, a side of the hole in the display device may be exposed to external water, oxygen, etc. For this reason, a reliability problem such as degradation of the light emitting element may occur in the display device.

Also, the light sensor used in the display device is an inorganic light sensor, and has problems in that it is expensive and lightweight and occupies a large space due to a large volume.

BRIEF SUMMARY

The present disclosure has been made in view of the above problems, and it is a technical benefit of the present disclosure to provide a display device that may reduce or minimize the decrease of a size of a display area caused by a light sensor.

It is another technical benefit of the present disclosure to provide a display device that may include a light sensor in a display panel.

In addition to the technical benefits of the present disclosure as mentioned above, additional technical benefits and features of the present disclosure will be clearly understood by those skilled in the art from the following description of the present disclosure.

In accordance with an aspect of the present disclosure, the above and other technical benefits can be accomplished by the provision of a display device comprising a substrate having a unit pixel area and a unit light sensor area, a first electrode over the substrate, a second electrode over the first electrode, a third electrode over the second electrode, a light emitting layer in the unit pixel area and disposed between the first electrode and the second electrode, and a light active layer disposed in the unit light sensor area between the second electrode and the third electrode.

In accordance with another aspect of the present disclosure, the above and other technical benefits can be accomplished by the provision of a display device comprising a substrate having a plurality of unit pixel areas and a plurality of unit light sensor areas, a plurality of light emitting elements disposed in the plurality of unit pixel areas, and including a first anode electrode, a light emitting layer, and a first cathode electrode, and a plurality of organic light emitting elements disposed in the plurality of unit light sensor areas, and including a second anode electrode, a light active layer, and a second cathode electrode, wherein the first cathode electrode of the plurality of light emitting elements and the second cathode electrode of the plurality of organic light emitting elements are provided on the same layer.

BRIEF DESCRIPTION OF THE SEVERAL VIEWS OF THE DRAWINGS

The above and other technical benefits, features and other advantages of the present disclosure will be more clearly understood from the following detailed description taken in conjunction with the accompanying drawings, in which.

DETAILED DESCRIPTION

Figure 1:
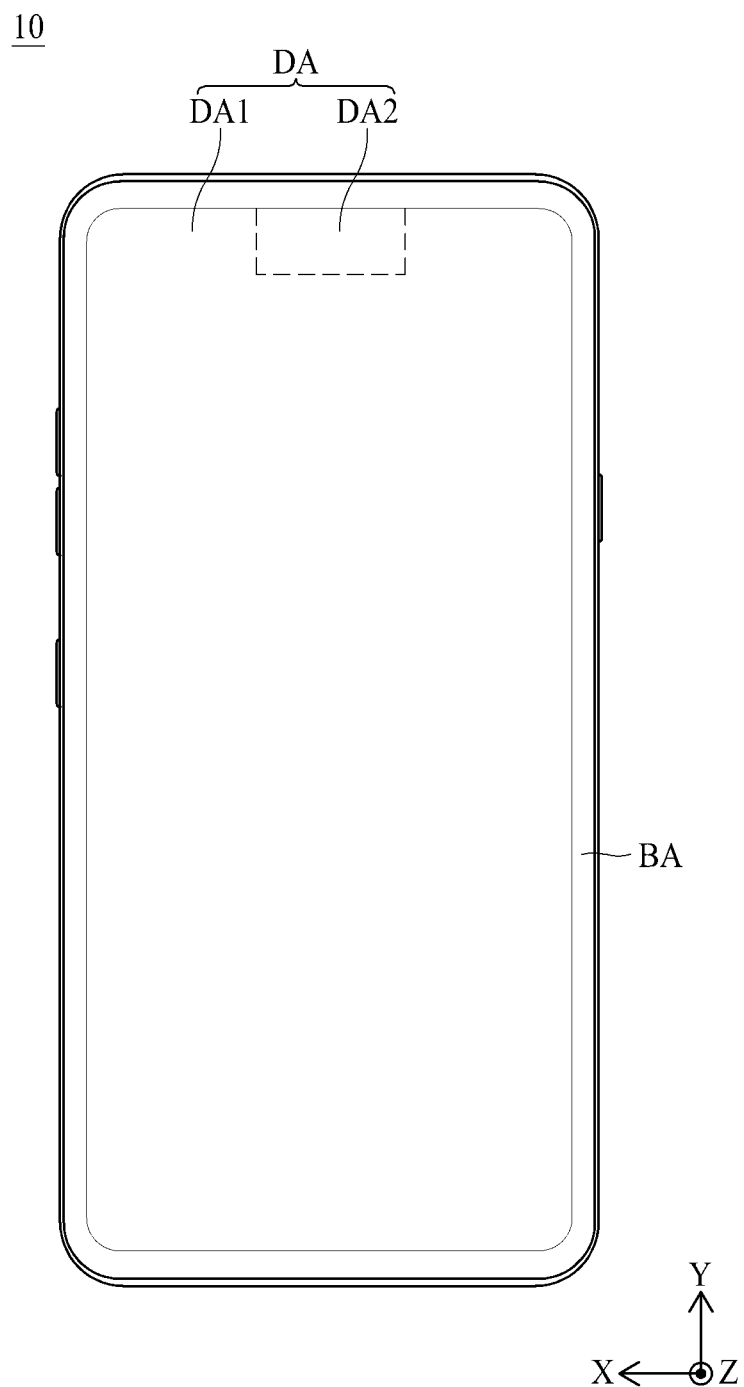
FIG. 1 is a schematic plan view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specifically mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

Figure 2:
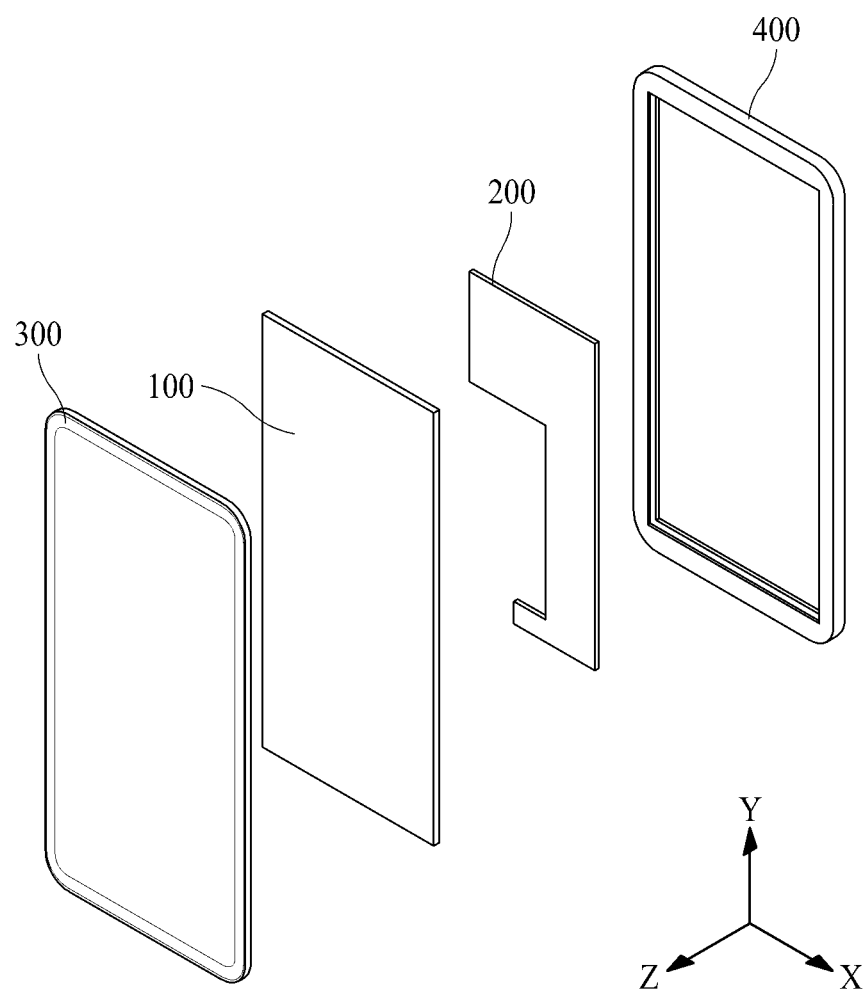
FIG. 2 is a schematic exploded view illustrating a display device according to one embodiment of the present disclosure.

FIG. 1 is a schematic plan view illustrating a display device according to one embodiment of the present disclosure, and FIG. 2 is a schematic exploded view illustrating a display device according to one embodiment of the present disclosure.

Referring to FIGS. 1 and 2, a display device 10 according to one embodiment of the present disclosure may include a display panel 100, a circuit board 200, a cover window 300, and a frame 400.

Although the display panel 100 is described as being implemented as an organic light emitting display device, it may also be implemented as a liquid crystal display device, a plasma display panel (PDP), a quantum dot light emitting display (QLED) device, or an electrophoretic display device.

The display panel 100 may include a display area DA in which pixels are formed, and a bezel area BA disposed near the display area DA. The display area DA may display an image, and may include a first display area DA1 and a second display area DA2.

The bezel area BA may not display an image, and may be disposed to surround the display area DA. The bezel area BA may include a driver for supplying various signals to a plurality of signal lines in the display area DA, and a link portion for connecting the driver with the plurality of signal lines. The driver may include a gate driver for supplying a gate signal to a gate line, and a data driver for supplying a data signal to a data line.

The circuit board 200 may be disposed over a rear surface of the display panel 100. The circuit board 200 may be a printed circuit board (PCB) or a flexible printed circuit board (FPCB).

The cover window 300 may be disposed over a front surface of the display panel 100. The cover window 300 may protect the display panel 100 from external impact by covering the front surface of the display panel 100.

The cover window 300 may be made of a transparent plastic material, a glass material, or a reinforced glass material. As an example, the cover window 300 may have any one of a sapphire glass and a gorilla glass or a stacked structure thereof. As another example, the cover window 300 may include any one material of polyethyleneterephthalate (PET), polycarbonate (PC), polyethersulfone (PES), polyethylenapthanate (PEN), and polynorbornene (PNB). The cover window 300 may be made of reinforced glass in consideration of scratch and transparency.

The frame 400 may accommodate the display panel 100 and support the cover window 300. The frame 400 may include an accommodating portion capable of accommodating the circuit board 200. The frame 400 allows the display panel 100 and the circuit board 200 to be fixed to the display device 10. The frame 400 may serve to protect the display panel 100 and the circuit board 200 from impact. The frame 400 may be a middle frame or a housing, but is not limited thereto.

Hereinafter, the elements provided in the display area DA of the display panel 100 will be described in more detail.

Figure 3:
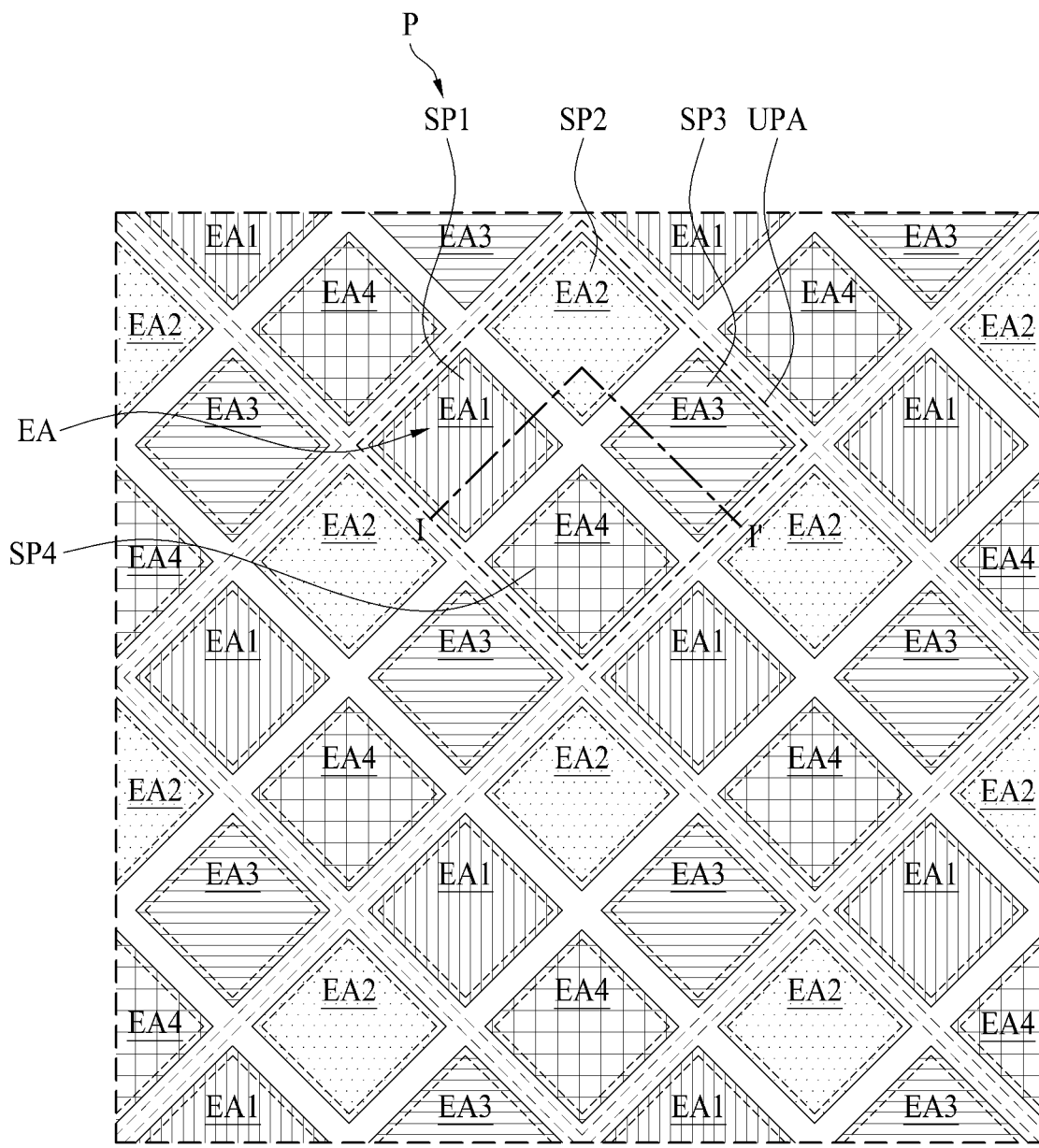
FIG. 3 is a view illustrating an example of a pixel provided in a first display area of FIG. 1.
Figure 4:
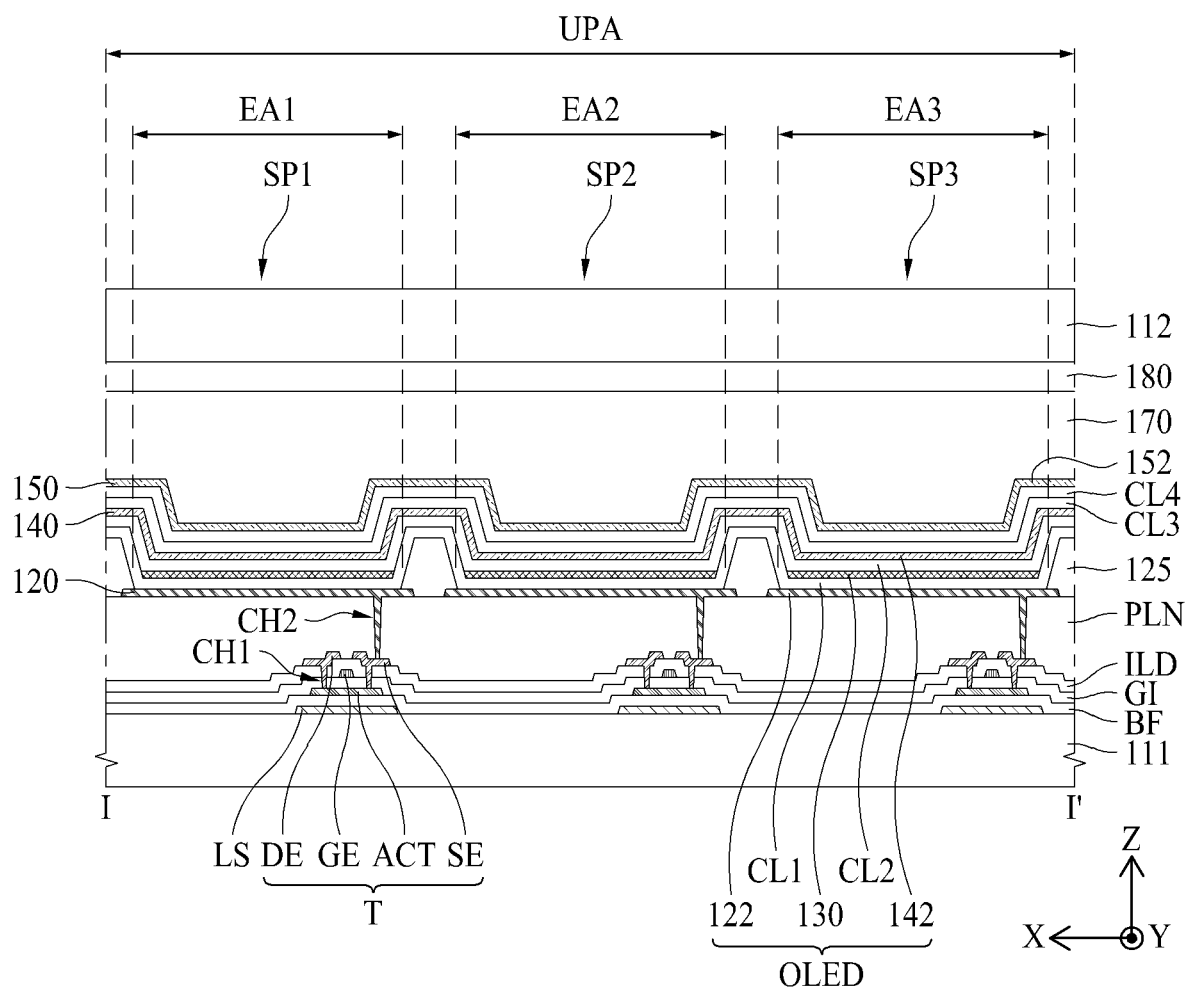
FIG. 4 is a cross-sectional view taken along line I-I' of FIG. 3.
Figure 5:
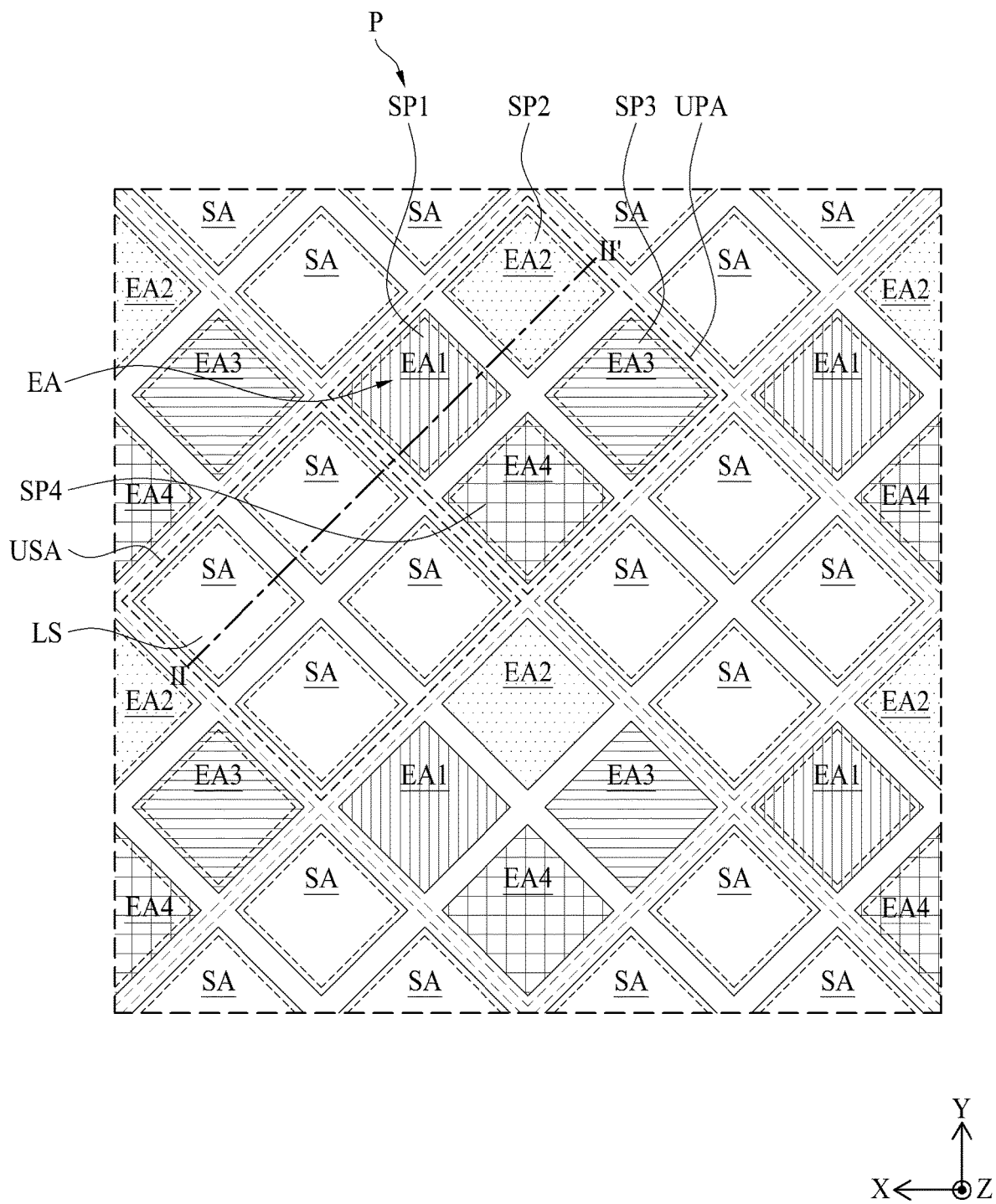
FIG. 5 is a view illustrating an example of a pixel and a light sensor, which are provided in a second display area of FIG. 1.
Figure 6:
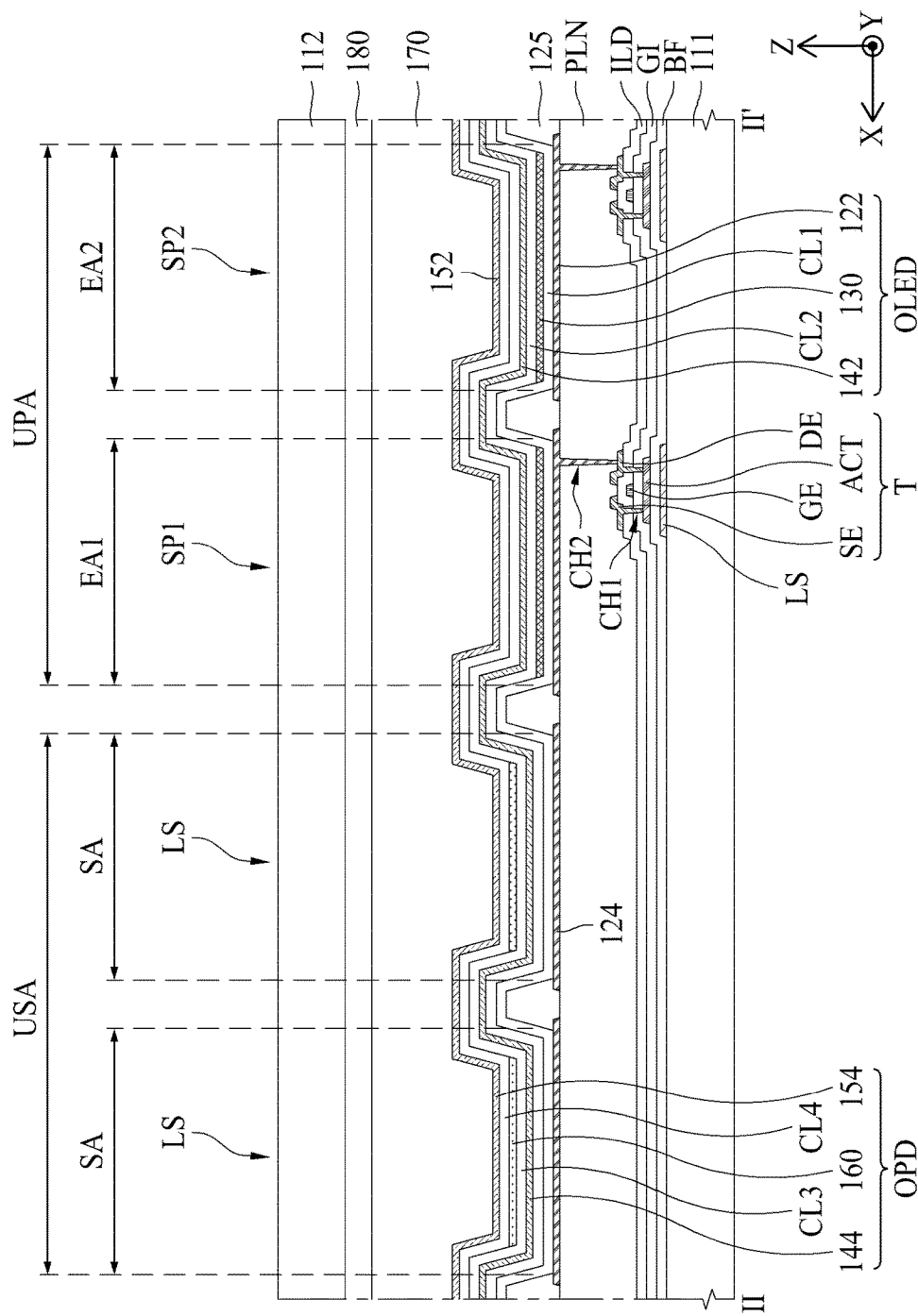
FIG. 6 is a cross-sectional view taken along line II-IP of FIG. 5.
Figure 7:
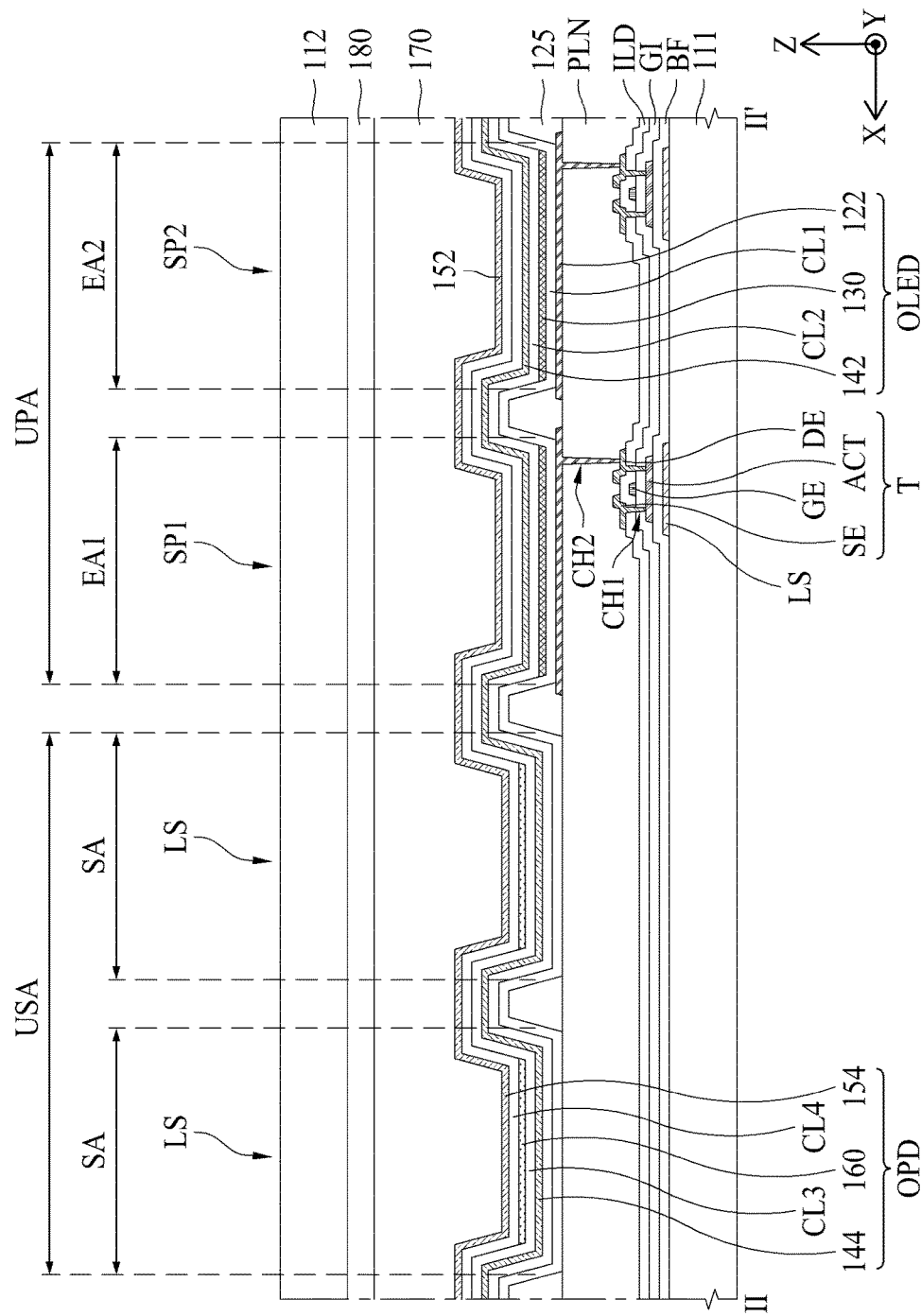
FIG. 7 is a view illustrating a modified example of FIG. 6.
Figure 8:
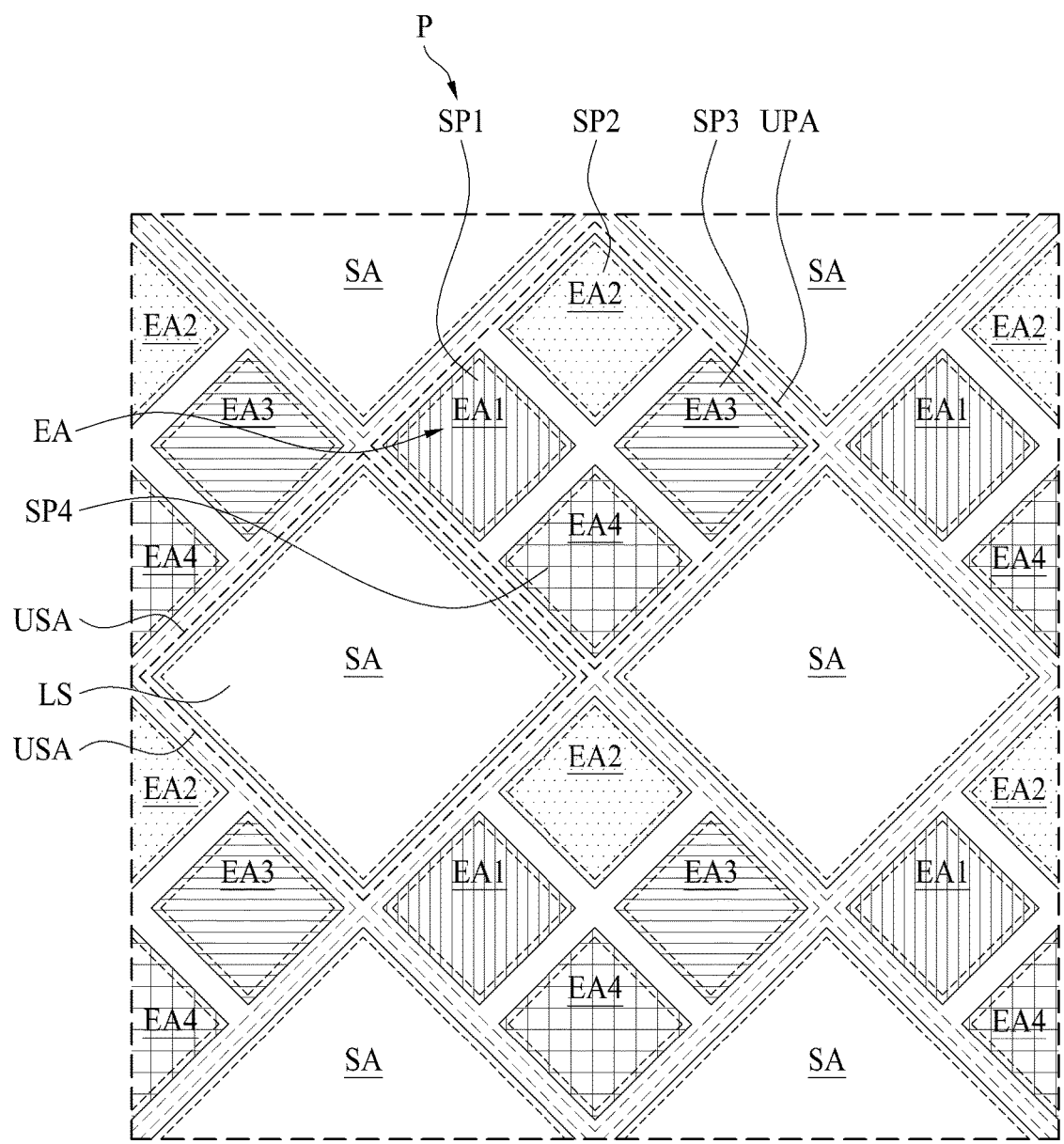
FIG. 8 is a view illustrating a modified example of FIG. 5.

FIG. 3 is a view illustrating an example of a pixel provided in a first display area of FIG. 1, FIG. 4 is a cross-sectional view taken along line I-I' of FIG. 3, FIG. 5 is a view illustrating an example of a pixel and a light sensor, which are provided in a second display area of FIG. 1, FIG. 6 is a cross-sectional view taken along line II-IP of FIG. 5, FIG. 7 is a view illustrating a modified example of FIG. 6, and FIG. 8 is a view illustrating a modified example of FIG. 5.

The first display area DA1 may include a plurality of unit pixel areas UPA as shown in FIG. 3. In the first display area DA1, the plurality of unit pixel areas UPA may be disposed to be adjacent to each other.

As shown in FIG. 5, the second display area DA2 may include a plurality of unit pixel areas UPA, which are the same as those of the first display area DA1, and may further include a plurality of unit light sensor areas USA. The second display area DA2 may have an aperture ratio lower than that of the first display area DA1 as a unit light sensor area USA is provided between the plurality of unit pixel areas UPA. The second display area DA2 may have luminance lower than that of the first display area DA1.

Each of the plurality of unit light sensor areas USA may include at least one light sensor LS. The light sensor LS senses external light by absorbing light incident from the outside. In this case, the light incident from the outside may be light of infrared ray (IR) irradiated toward a target and reflected from the target. The sensing area SA may correspond to an area for sensing light in the light sensor LS.

In one embodiment, the unit light sensor area USA may be provided with the same number of light sensors LS as the number of subpixels SP1, SP2, SP3 and SP4 provided in the unit pixel area UPA. For example, when four subpixels SP1, SP2, SP3 and SP4 are provided in the unit pixel area UPA, four light sensors LS may be provided in the unit light sensor area USA, but the present disclosure is not limited thereto.

In another embodiment, the unit light sensor area USA may be provided with one light sensor LS as shown in FIG. 8. In this case, the unit light sensor area USA may have the same size as that of the unit pixel area UPA, but is not limited thereto.

Each of the plurality of unit pixel areas UPA may be provided with one pixel P. The pixel P emits predetermined or selected light to display an image. A light emission area EA may correspond to an area that emits light in the pixel P.

The pixel P may include a first subpixel SP1, a second subpixel SP2, and a third subpixel SP3. The first subpixel SP1 may emit red light, the second subpixel SP2 may emit green light, and the third subpixel SP3 may emit blue light, but the present disclosure is not limited thereto. The pixel P may further include a fourth subpixel SP4 that emits white light. The arrangement order of the plurality of subpixels SP1, SP2, SP3 and SP4 is not limited to those shown in FIGS. 3 and 5, but may be changed in various ways. It is to be noted that, although FIGS. 3, 5 and 8 have shown examples of the arrangement and size of the unit light sensor area USA and the unit pixel area UPA, the present disclosure is not limited thereto. For example, the fourth subpixel SP4 that emits white light may be omitted, and the unit light sensor area USA may have a same size as one subpixel and thus replace the position of the fourth subpixel SP4.

Each of the first subpixel SP1, the second subpixel SP2, the third subpixel SP3, and the fourth subpixel SP4 may be provided with a circuit element, which includes a capacitor, a thin film transistor, etc., and a light emitting element. The thin film transistor may include a switching transistor, a sensing transistor, and a driving transistor T.

The switching transistor is switched in accordance with a scan signal supplied to a scan line to supply a data voltage supplied from the data line to the driving transistor T.

The sensing transistor serves to sense a deviation in a threshold voltage of the driving transistor T, which causes deterioration of image quality.

The driving transistor T is switched in accordance with the data voltage supplied from the switching transistor to generate a data current from a power source supplied from a pixel power line and supply the data current to a first anode electrode 122 of the subpixels SP1, SP2, SP3 and SP4. The driving transistor T includes an active layer ACT, a gate electrode GE, a source electrode SE and a drain electrode DE.

In detail, a light shielding layer LS may be provided over a first substrate 111. The light shielding layer LS may serve to shield external light incident on the active layer ACT of the driving transistor T. The light shielding layer LS may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

A buffer film BF may be provided over the light shielding layer LS. The buffer film BF is intended to protect the transistors T from water permeated through the first substrate vulnerable to moisture permeation, and may be formed of an inorganic layer, for example, a silicon oxide layer (SiOx), a silicon nitride layer (SiNx), or a multi-layer of SiOx and SiNx.

The active layer ACT may be provided over the buffer film BF. The active layer ACT may be formed of a silicon-based semiconductor material or an oxide-based semiconductor material.

A gate insulating layer GI may be provided over the active layer ACT. The gate insulating layer GI may be formed of an inorganic layer, for example, a silicon oxide layer (SiOx), a silicon nitride layer (SiNx), or a multi-layer of SiOx and SiNx.

The gate electrode GE may be provided over the gate insulating layer GI. The gate electrode GE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

An interlayer dielectric layer ILD may be provided over the gate electrode GE. The interlayer dielectric layer ILD may be formed of an inorganic layer, for example, a silicon oxide layer (SiOx), a silicon nitride layer (SiNx), or a multi-layer of SiOx and SiNx.

The source electrode SE and the drain electrode DE may be provided over the interlayer dielectric layer ILD. One of the source electrode SE and the drain electrode DE may be connected to the active layer ACT through a first contact hole CH1 that passes through the gate insulating layer GI and the interlayer dielectric layer ILD.

The source electrode SE and the drain electrode DE may be formed of a single layer or multi-layer made of any one of molybdenum (Mo), aluminum (Al), chromium (Cr), gold (Au), titanium (Ti), nickel (Ni), neodymium (Nd) and copper (Cu), or their alloy.

A planarization layer PLN may be provided over the source electrode SE and the drain electrode DE to planarize a step difference due to the driving transistor T. The planarization layer PLN may be formed of an organic layer such as an acrylic resin, an epoxy resin, a phenolic resin, a polyamide resin, and a polyimide resin.

A plurality of organic light emitting diodes OLED and a plurality of organic photo diodes OPD may be provided over the planarization layer PLN.

As shown in FIG. 4, the first display area DA1 may be provided with only a plurality of organic light emitting diodes OLED over the planarization layer PLN. On the other hand, as shown in FIG. 6, the second display area DA2 may be provided with a plurality of organic light emitting diodes OLED and a plurality of organic photo diodes OPD on the planarization layer PLN. For convenience of description, the following description will be based on the second display area DA2. The description of the organic light emitting diodes OLED of the second display area DA2 may also be applied to the organic light emitting diodes OLED of the first display area DA1.

In order to implement the plurality of organic light emitting diodes OLED and the plurality of organic photo diodes OPD, the display panel 100 according to one embodiment of the present disclosure may include a first electrode 120 provided over the planarization layer PLN. The first electrode 120 may include a first anode electrode 122 provided in the unit pixel area UPA and a first dummy anode electrode 124 provided in the unit light sensor area USA.

The first anode electrode 122 may be provided in the unit pixel area UPA, and may be provided for each of the subpixels SP1, SP2, SP3 and SP4 on the planarization layer PLN. The first anode electrode 122 may be connected to the driving transistor T. In detail, the first anode electrode 122 may be connected to the source electrode SE or the drain electrode DE of the driving transistor T through a second contact hole CH2 that passes through the planarization layer PLN. Therefore, the first anode electrode 122 may be electrically connected to the driving transistor T. The first anode electrode 122 may be an anode electrode of the organic light emitting diode OLED.

The first dummy anode electrode 124 may be provided in the unit light sensor area USA, and may be provided for each of the light sensors LS over the planarization layer PLN. The first dummy anode electrode 124 may be disposed on the same layer as the first anode electrode 122, and may be spaced apart from the first anode electrode 122. The first dummy anode electrode 124 may be formed to be patterned on the same layer as the first anode electrode 122 in substantially the same shape as that of the first anode electrode 122, but does not correspond to the configuration of the organic photo diode OPD. That is, the first dummy anode electrode 124 is formed together with the first anode electrode 122 while forming the first anode electrode 122 without changing the existing mask, and does not belong to the organic photo diode OPD. Therefore, the first dummy anode electrode 124 may be omitted as shown in FIG. 7.

The first electrode 120 that includes the first anode electrode 122 and the first dummy anode electrode 124 may be formed of a metal material having high reflectance, such as a stacked structure (Ti/Al/Ti) of aluminum and titanium, a stacked structure (ITO/Al/ITO) of aluminum and ITO, an Ag alloy, a stacked structure (ITO/Ag alloy/ITO) of Ag alloy and ITO, a MoTi alloy, and a stacked structure (ITO/MoTi alloy/ITO) of MoTi alloy and ITO. The Ag alloy may be an alloy of silver (Ag), palladium (Pd), copper (Cu), etc. The MoTi alloy may be an alloy of molybdenum (Mo) and titanium (Ti).

The bank 125 may be provided between the plurality of subpixels SP1, SP2, SP3 and SP4 over the planarization layer PLN. At this time, the bank 125 may be formed to cover or at least partially cover the edge of the first anode electrode 122 of each of the plurality of subpixels SP1, SP2, SP3 and SP4 and expose a portion of the first anode electrode 122. Therefore, the bank 125 may prevent a problem in which light emitting efficiency is deteriorated due to concentration of current on an end of the first anode electrode 122.

The bank 125 may abut light emission areas EA1, EA2 and EA3 of the subpixels SP1, SP2, SP3 and SP4. The light emission areas EA1, EA2 and EA3 of each of the sub-pixels SP1, SP2, SP3 and SP4 represent an area in which the first anode electrode 122, a light emitting layer 130 and a first cathode electrode 142 are sequentially stacked and holes from the first anode electrode 122 and electrons from the first cathode electrode 142 are combined with each other in the light emitting layer 130 to emit light. In this case, the area in which the bank 125 is not provided and the first anode electrode 122 is exposed may become the light emission area EA, and the other area may become a non-light emission area NEA.

Meanwhile, the bank 125 may be provided between the plurality of light sensors LS. At this time, the bank 125 may be formed to cover or at least partially cover the edge of the first dummy anode electrode 124 of each of the plurality of light sensors LS and expose a portion of the first dummy anode electrode 124.

The bank 125 may be formed of an organic layer such as an acrylic resin, an epoxy resin, a phenolic resin, a polyamide resin, and a polyimide resin.

The display panel 100 according to one embodiment of the present disclosure may include a first common layer CL1 provided over the first electrode 120. The first common layer CL1 may include a hole transporting layer. In one embodiment, the first common layer CL1 may further include at least one of a hole injection layer or an electron blocking layer.

The hole injection layer serves to smoothly inject holes from the first electrode 120, particularly from the first anode electrode 122 into the light emitting layer 130. The hole transporting layer serves to smoothly transfer the holes to the light emitting layer 130. The electron blocking layer serves to prevent electrons injected into the light emitting layer 130 from being transferred to the hole transporting layer.

The first common layer CL1 may also be provided in the unit light sensor area USA as well as the unit pixel area UPA. That is, the first common layer CL1 may be provided over the first anode electrode 122 and the first dummy anode electrode 124. The first common layer CL1 may be a common layer commonly provided in the plurality of subpixels SP1, SP2, SP3 and SP4 and the light sensor LS.

The display panel 100 according to one embodiment of the present disclosure may include a second common layer CL2 provided over the first common layer CL1. The second common layer CL2 may include an electron transporting layer. In one embodiment, the second common layer CL2 may further include a hole blocking layer.

The electron transporting layer serves to smoothly transfer electrons injected from the second electrode 140, particularly the first cathode electrode 142 to the light emitting layer 130. The hole blocking layer serves to prevent holes injected into the light emitting layer 130 from being transferred to the electron transporting layer.

The second common layer CL2 may also be provided in the unit light sensor area USA as well as the unit pixel area UPA. That is, the second common layer CL2 may be provided over the light emitting layer 130 in the unit pixel area UPA, and may be provided over the first common layer CL1 in the unit light sensor area USA. The second common layer CL2 may be a common layer commonly provided in the plurality of subpixels SP1, SP2, SP3 and SP4 and the light sensor LS.

The display panel 100 according to one embodiment of the present disclosure may include a light emitting layer 130 provided between the first common layer CL1 and the second common layer CL2. When holes and electrons are transferred to the light emitting layer 130 through the hole transporting layer and the electron transporting layer, respectively, the holes and the electrons may be combined with each other in the light emitting layer 130 to emit light.

The light emitting layer 130 may be provided for each of the subpixels SP1, SP2, SP3 and SP4. For example, a red light emitting layer for emitting red light may be provided in the first subpixel SP1, a green light emitting layer for emitting green light may be provided in the second subpixel SP2, and a blue light emitting layer for emitting blue light may be provided in the third subpixel SP3. The fourth subpixel SP4 may include, but is not limited to, a white light emitting layer for emitting white light.

The light emitting layer 130 is provided in the subpixels SP1, SP2, SP3 and SP4 of the unit pixel area UPA, and the first common layer CL1 and the second common layer CL2 may be spaced apart from each other with the light emitting layer 130 interposed therebetween in the unit pixel area UPA. Meanwhile, the light emitting layer 130 may not be provided in the unit light sensor area USA. Therefore, the first common layer CL1 and the second common layer CL2 may be in contact with each other in the entire unit light sensor area USA. Therefore, each of the subpixels SP1, SP2, SP3 and SP4 of the unit pixel area UPA includes light emission areas EA1, EA2 and EA3 emitting a predetermined or selected color, whereas the unit light sensor area USA may not include a light emission area.

The display panel 100 according to one embodiment of the present disclosure may include a second electrode 140 provided over the second common layer CL2. The second electrode 140 may include a first cathode electrode 142 provided in the unit pixel area UPA and a second cathode electrode 144 provided in the unit light sensor area USA.

The first cathode electrode 142 may be provided in the unit pixel area UPA, and may be commonly provided in the subpixels SP1, SP2, SP3 and SP4. The first cathode electrode 142 may be a cathode electrode of the organic light emitting diode OLED.

The second cathode electrode 144 is provided in the unit light sensor area USA, and may be commonly provided in the light sensors LS. The second cathode electrode 144 may be a cathode electrode of the organic photo diode OPD.

The second cathode electrode 144 may be provided over the same layer as the first cathode electrode 142, and may be connected to the first cathode electrode 142. For example, the first cathode electrode 142 and the second cathode electrode 144 may be integrally formed.

The second electrode 140 that includes the first cathode electrode 142 and the second cathode electrode 144 may be formed of a transparent conductive material (TCO) such as ITO and IZO, which may transmit light, or a semi-transmissive conductive material such as magnesium (Mg), silver (Ag) or an alloy of magnesium (Mg) and silver (Ag). When the second electrode 140 is formed of a semi-transmissive metal material, light output efficiency may be increased by a micro cavity in the plurality of subpixels SP1, SP2, SP3 and SP4.

The display panel 100 according to one embodiment of the present disclosure may include a third common layer CL3 provided over the second electrode 140. The third common layer CL3 may include a hole transporting layer. In one embodiment, the third common layer CL3 may further include at least one of a hole injection layer or an electron blocking layer.

The hole injection layer serves to smoothly inject the holes from a light active layer 160 into the second electrode 140, particularly the second cathode electrode 144. The hole transporting layer serves to smoothly transfer the holes injected from the light active layer 160 to the second electrode 140, particularly the second cathode electrode 144. The electron blocking layer serves to prevent electrons from being transferred to the hole transporting layer.

Each of the hole injection layer, the hole transporting layer, and the electron blocking layer of the third common layer CL3 may have a material different from that of each of the hole injection layer, the hole transporting layer, and the electron blocking layer of the first common layer CL1, but is not limited thereto. The material of each of the hole injection layer, the hole transporting layer, and the electron blocking layer of the third common layer CL3 may be selected in consideration of the material of the light active layer 160. In some cases, each of the hole injection layer, the hole transporting layer, and the electron blocking layer of the third common layer CL3 may be formed of the same material as that of each of the hole injection layer, the hole transporting layer, and the electron blocking layer of the first common layer CL1.

The third common layer CL3 may also be provided in the unit light sensor area USA as well as the unit pixel area UPA. That is, the third common layer CL3 may be provided over the first cathode electrode 142 of the unit pixel area UPA and the second cathode electrode 144 of the unit light sensor area USA. The third common layer CL3 may be a common layer commonly provided in the plurality of subpixels SP1, SP2, SP3 and SP4 and the light sensor LS.

The display panel 100 according to one embodiment of the present disclosure may include a fourth common layer CL4 provided over the third common layer CL3. The fourth common layer CL4 may include an electron transporting layer. In one embodiment, the fourth common layer CL4 may further include a hole blocking layer.

The electron transporting layer serves to smoothly transfer electrons to a second anode electrode 154. The hole blocking layer serves to prevent the holes from being transferred to the electron transporting layer.

Each of the electron transporting layer and the hole blocking layer of the fourth common layer CL4 may have a material different from that of each of the electron transporting layer and the hole blocking layer of the second common layer CL2, but is not limited thereto. The material of each of the electron transporting layer and the hole blocking layer of the fourth common layer CL4 may be selected in consideration of the material of the light active layer 160. In some cases, each of the electron transporting layer and the hole blocking layer of the fourth common layer CL4 may be formed of the same material as that of each of the electron transporting layer and the hole blocking layer of the second common layer CL2.

The fourth common layer CL4 may also be provided in the unit light sensor area USA as well as the unit pixel area UPA. That is, the fourth common layer CL4 may be provided over the third common layer CL3 in the unit pixel area UPA, and may be provided over the light active layer 160 in the unit light sensor area USA. The fourth common layer CL4 may be a common layer commonly provided in the plurality of subpixels SP1, SP2, SP3 and SP4 and the light sensor LS.

The display panel 100 according to one embodiment of the present disclosure may include a light active layer 160 provided between the third common layer CL3 and the fourth common layer CL4. The light active layer 160 may absorb light incident from the outside. At this time, the light incident from the outside may be light of infrared ray (IR) irradiated toward a target and reflected from the target. The light active layer 160 absorbs light and thus is changed from a ground state to an excited state, and may separate the electrons from the holes. The electrons are transferred to the second cathode electrode 144 through the third common layer CL3, and the holes may be transferred to the second anode electrode 154 through the fourth common layer CL4. Therefore, a potential difference is generated between the second cathode electrode 144 and the second anode electrode 154, and a current may flow.

The light active layer 160 may be made of a material having a Perovskite structure. The Perovskite structure has an $ABX_3$ structure, wherein A may include an organic cation such as Methylammonium (MA) and Formamidium (FA), or an inorganic cation such as Cs, and B may include one of Pb, Sn, and Ge. X may include a halide based material.

The light active layer 160 may be provided in the light sensor LS. In one embodiment, the light active layer 160 may be formed to be patterned in each of the light sensors LS, as shown in FIG. 6, but is not limited thereto. In another embodiment, the light active layer 160 may be formed in one pattern in a plurality of adjacent light sensors LS.

The light active layer 160 is provided in the light sensors LS of the unit light sensor area USA, and the third common layer CL3 and the fourth common layer CL4 may be spaced apart from each other with the light active layer 160 interposed therebetween in the unit light sensor area USA. Meanwhile, the light active layer 160 may not be provided in the subpixels SP1, SP2, SP3 and SP4 of the unit pixel area UPA. Therefore, the third common layer CL3 and the fourth common layer CL4 may be in contact with each other in the entire unit pixel area UPA. Therefore, the light sensors LS of the unit light sensor area USA may include a sensing area SA for sensing the light incident from the outside, whereas the unit pixel area UPA may not include a sensing area. That is, the sensing area SA may be provided in the unit light sensor area USA, and the light emission area EA may be provided in the unit pixel area UPA. In addition, the sensing area SA and the light emission area EA may not overlap each other.

The display panel 100 according to one embodiment of the present disclosure may include a third electrode 150 provided over the fourth common layer CL4. The third electrode 150 may include a second dummy anode electrode 152 provided in the unit pixel area UPA and a second anode electrode 154 provided in the unit light sensor area USA.

The second anode electrode 154 is provided in the unit light sensor area USA, and may be commonly provided in the light sensors LS. The second anode electrode 154 may be an anode electrode of the organic photo diode OPD.

The second dummy anode electrode 152 may be provided in the unit pixel area UPA, and may be commonly provided in the plurality of subpixels SP1, SP2, SP3 and SP4. The second dummy anode electrode 152 may be provided on the same layer as the second anode electrode 154, and may be connected to the second anode electrode 154. For example, the second dummy anode electrode 152 and the second anode electrode 154 may be integrally formed.

The second dummy anode electrode 152 may be formed on the same layer as the second anode electrode 154 simultaneously with the second anode electrode 154, but does not correspond to the configuration of the organic light emitting diode OLED. That is, the second dummy anode electrode 152 is formed together with the second anode electrode 154 without changing the existing mask, and does not belong to the organic light emitting diode OLED. Therefore, the second dummy anode electrode 152 may be omitted.

The third electrode 150 that includes the second dummy anode electrode 152 and the second anode electrode 154 may be formed of a transparent conductive material (TCO) such as ITO or IZO, which may transmit light, so as to transfer external light to the light active layer 160.

An encapsulation layer 170 may be provided over the organic light emitting diodes OLED and the organic photo diode OPD. The encapsulation layer 170 may be provided over the third electrode 150 to cover or at least partially cover the third electrode 150. The encapsulation layer 170 serves to prevent oxygen or water from being permeated into the organic light emitting diodes OLED and the organic photo diodes OPD. To this end, the encapsulation layer 170 may include at least one inorganic layer and at least one organic layer.

Although not shown in FIGS. 4 and 6, a capping layer may be additionally provided between the third electrode 150 and the encapsulation layer 170.

The first substrate 111 and the second substrate 112, in which the encapsulation layer 170 is provided, may be bonded to each other by a separate adhesive layer 180. The adhesive layer 180 may be an optically clear resin layer (OCR) or an optically clear adhesive film (OCA).

The display panel 100 according to one embodiment of the present disclosure includes a light sensor LS therein. In more detail, the display panel 100 according to one embodiment of the present disclosure may include a plurality of organic light emitting diodes OLED for emitting light and a plurality of organic photo diodes OPD for absorbing external light, on the planarization layer PLN.

Each of the plurality of organic light emitting diodes OLED may include a first anode electrode 122, a first common layer CL1, a light emitting layer 130, a second common layer CL2, and a first cathode electrode 142. In each of the plurality of organic light emitting diodes OLED, holes from the first anode electrode 122 and electrons from the first cathode electrode 142 may be combined with each other in the light emitting layer 130 to emit light of a predetermined or selected color.

Each of the plurality of organic photo diodes OPD may include a second cathode electrode 144, a third common layer CL3, a light active layer 160, a fourth common layer CL4, and a second anode electrode 154. In addition, in each of the plurality of organic photo diodes OPD, electrons and holes separated from each other by the light active layer 160 that absorbs external light may be transferred to the second cathode electrode 144 and the second anode electrode 154 to flow a current, and light may be measured based on the current.

At this time, each of the first common layer CL1, the second common layer CL2, the third common layer CL3 and the fourth common layer CL4 may be a common layer commonly provided in the plurality of organic light emitting diodes OLED and the plurality of organic photo diodes OPD. In addition, the first cathode electrode 142 of the organic light emitting diode OLED and the second cathode electrode 144 of the organic photo diode OPD may be simultaneously formed on the same layer.

In the display panel 100 according to one embodiment of the present disclosure, the organic photo diodes OPD may be formed together with the organic light emitting diodes OED through a process of forming the organic light emitting diodes OLED. That is, in the display panel 100 according to one embodiment of the present disclosure, a separate process is not added to form the light sensor LS therein, and therefore, process complexity is not increased.

Also, in the display panel 100 according to one embodiment of the present disclosure, the organic photo diode OPD of the light sensor LS does not overlap the organic light emitting diodes OLED, and is not disposed below the organic light emitting diodes OLED. Therefore, in the display panel 100 according to one embodiment of the present disclosure, since light emitted from the organic light emitting diode OLED may not be incident on the organic photo diode OPD, interference light due to the organic light emitting diode OLED may not be generated.

In addition, in the display panel 100 according to one embodiment of the present disclosure, as the light sensor LS is formed therein, a separate hole for seating the light sensor LS may not be formed. In the display panel 100 according to one embodiment of the present disclosure, a hole passing through the display panel 100 is not formed, whereby external water, oxygen, etc., may be prevented from being permeated into the side of the hole. Therefore, the display panel 100 according to one embodiment of the present disclosure may prevent the organic light emitting diode OLED from being degraded, and may improve reliability.

In addition, in the display panel 110 according to one embodiment of the present disclosure, since a hole is not formed, an image may not be disconnected. Further, the display panel 100 according to one embodiment of the present disclosure may include a unit pixel area UPA provided with pixels P between the unit light sensor areas USA provided with the light sensors LS. Therefore, in the display panel 100 according to one embodiment of the present disclosure, an image may be displayed by the pixels P even in an area in which the light sensors LS are disposed.

The display panel 100 according to one embodiment of the present disclosure may include a second display area DA2 instead of a notch area in which an image is not displayed, wherein the second display area DA2 is provided with light sensors LS and pixels P to sense light and at the same time display an image. Therefore, the display panel 100 according to one embodiment of the present disclosure may prevent the area, in which an image is displayed, from being reduced by the light sensors LS.

Also, in the display panel 100 according to one embodiment of the present disclosure, an organic light sensor LS including an organic photo diode OPD may be applied instead of an inorganic semiconductor light sensor. Therefore, the display panel 100 according to one embodiment of the present disclosure may reduce costs, and may reduce weight.

Figure 9:
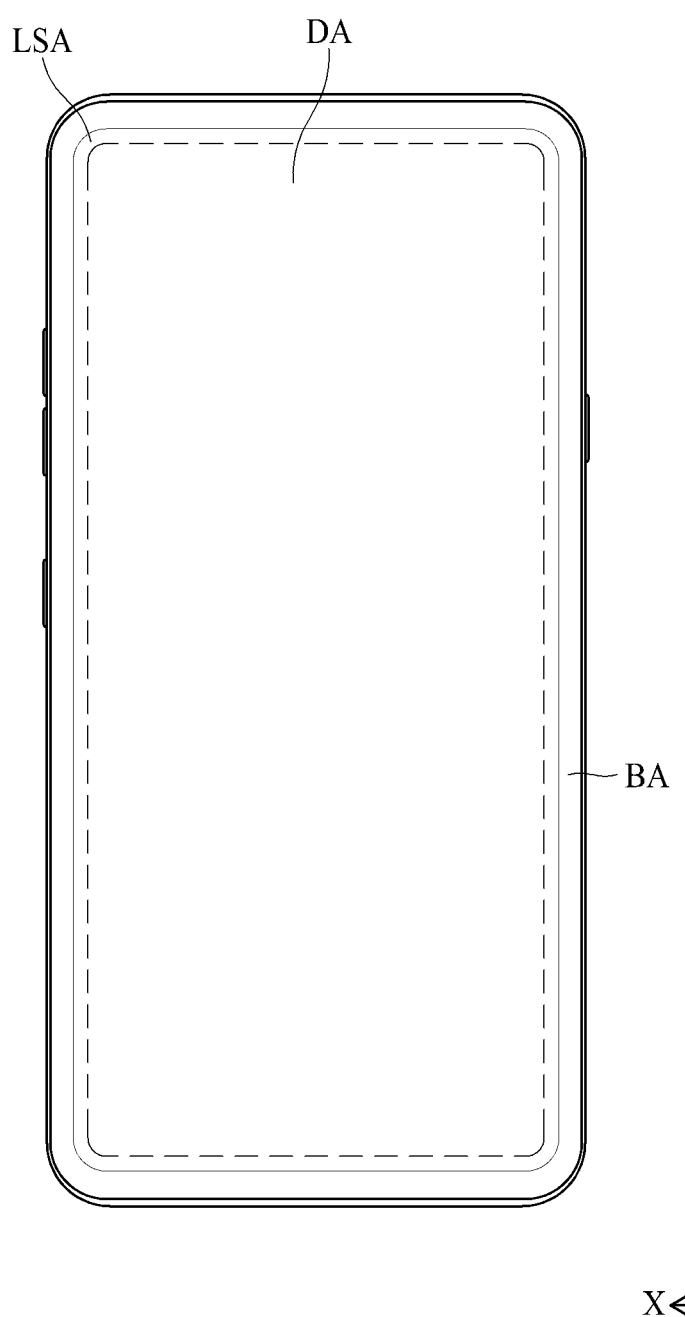
FIG. 9 is a schematic plan view illustrating a display device according to another embodiment of the present disclosure.
Figure 10:
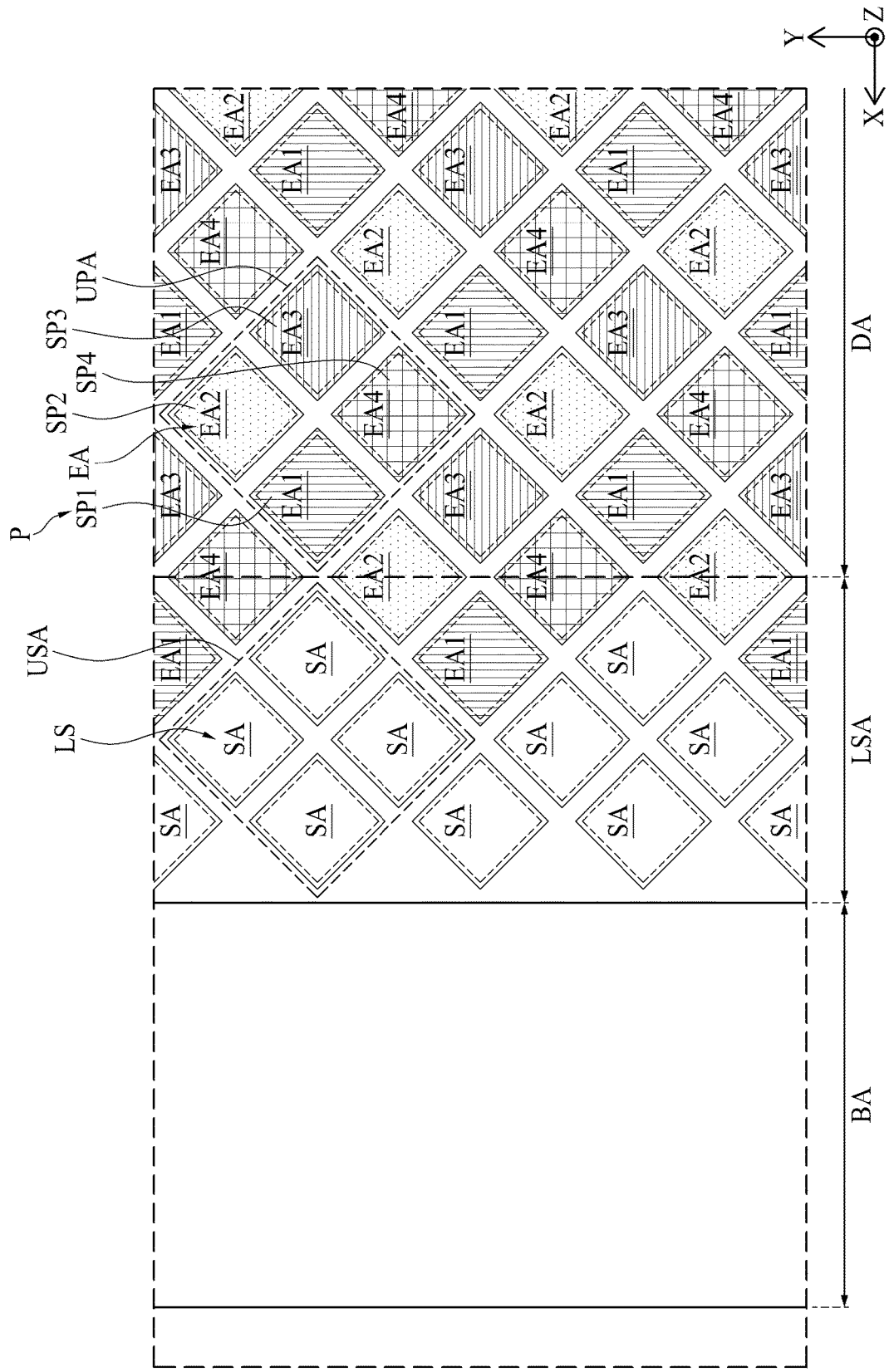
FIG. 10 is a view illustrating an example of a light sensor provided in a light sensor area and a pixel provided in a display area of FIG. 9.

FIG. 9 is a schematic plan view illustrating a display device according to another embodiment of the present disclosure, and FIG. 10 is a view illustrating an example of a light sensor provided in a light sensor area and a pixel provided in a display area of FIG. 9.

Referring to FIGS. 9 and 10, the display panel 100 according to another embodiment of the present disclosure may be divided into a display area DA and a bezel area BA disposed near the display area DA.

The display area DA includes a plurality of unit pixel areas UPA, and each of the plurality of unit pixel areas UPA may include a plurality of subpixels SP1, SP2, SP3 and SP4 provided with an organic light emitting diode OLED. Since each of the plurality of subpixels SP1, SP2, SP3 and SP4 is substantially the same as the organic light emitting diode OLED of the plurality of subpixels SP1, SP2, SP3 and SP4 shown in FIGS. 3 to 8, its detailed description will be omitted.

The bezel area BA may not display an image, and may be disposed to surround the display area DA.

In the display panel 100 according to another embodiment of the present disclosure, the light sensor area LSA is provided between the display area DA and the bezel area BA. The light sensor area LSA includes a plurality of unit light sensor areas USA, and each of the plurality of unit light sensor areas USA may include at least one light sensor LS provided with an organic photo diode OPD. Since the organic photo diode OPD of the at least one light sensor LS is substantially the same as the organic photo diode OPD of the light sensor LS shown in FIGS. 3 to 8, its detailed description will be omitted.

The light sensor area LSA may be disposed to surround the display area DA between the display area DA and the bezel area BA as shown in FIG. 9. As shown in FIG. 10, one or two unit light sensor areas USA may be disposed between the display area DA and the bezel area BA in the light sensor area LSA.

As described above, in the display panel 100 according to another embodiment of the present disclosure, the light sensor area LSA is disposed to surround the outside of the display area DA, whereby a notch area that is recessed from one side of the display area DA and recognized by a user may be removed. In addition, in the display panel 100 according to another embodiment of the present disclosure, the entire display area DA may have the same resolution and luminance. Therefore, the display panel 100 according to another embodiment of the present disclosure may prevent a portion of the display area DA from being visible to a user due to a difference in resolution and luminance as compared with the display panel 100 shown in FIGS. 1 to 8.

In addition, in the display panel 100 according to another embodiment of the present disclosure, only one or two unit light sensor areas USA may be disposed between the display area DA and the bezel area BA, whereby a size of the display area DA may not be significantly reduced.

Figure 11:
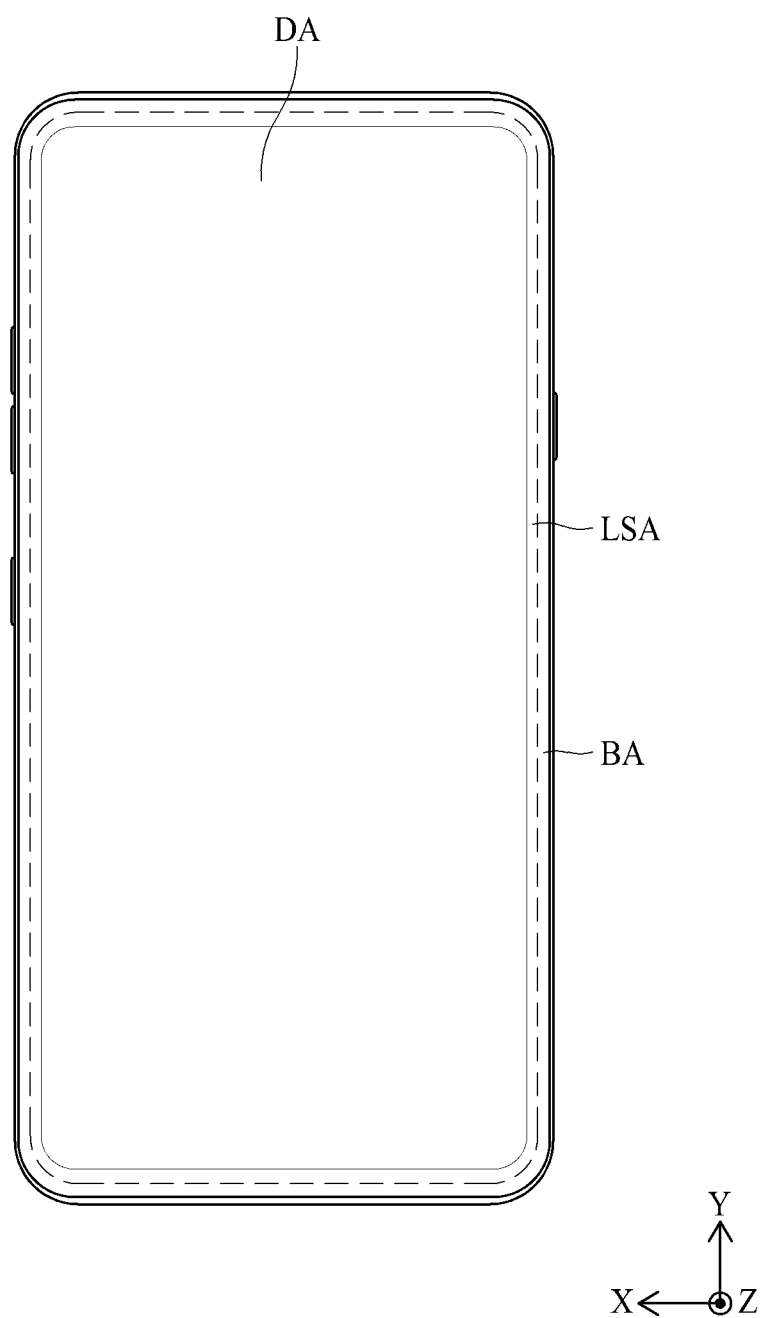
FIG. 11 is a schematic plan view illustrating a display device according to other embodiment of the present disclosure.
Figure 12:
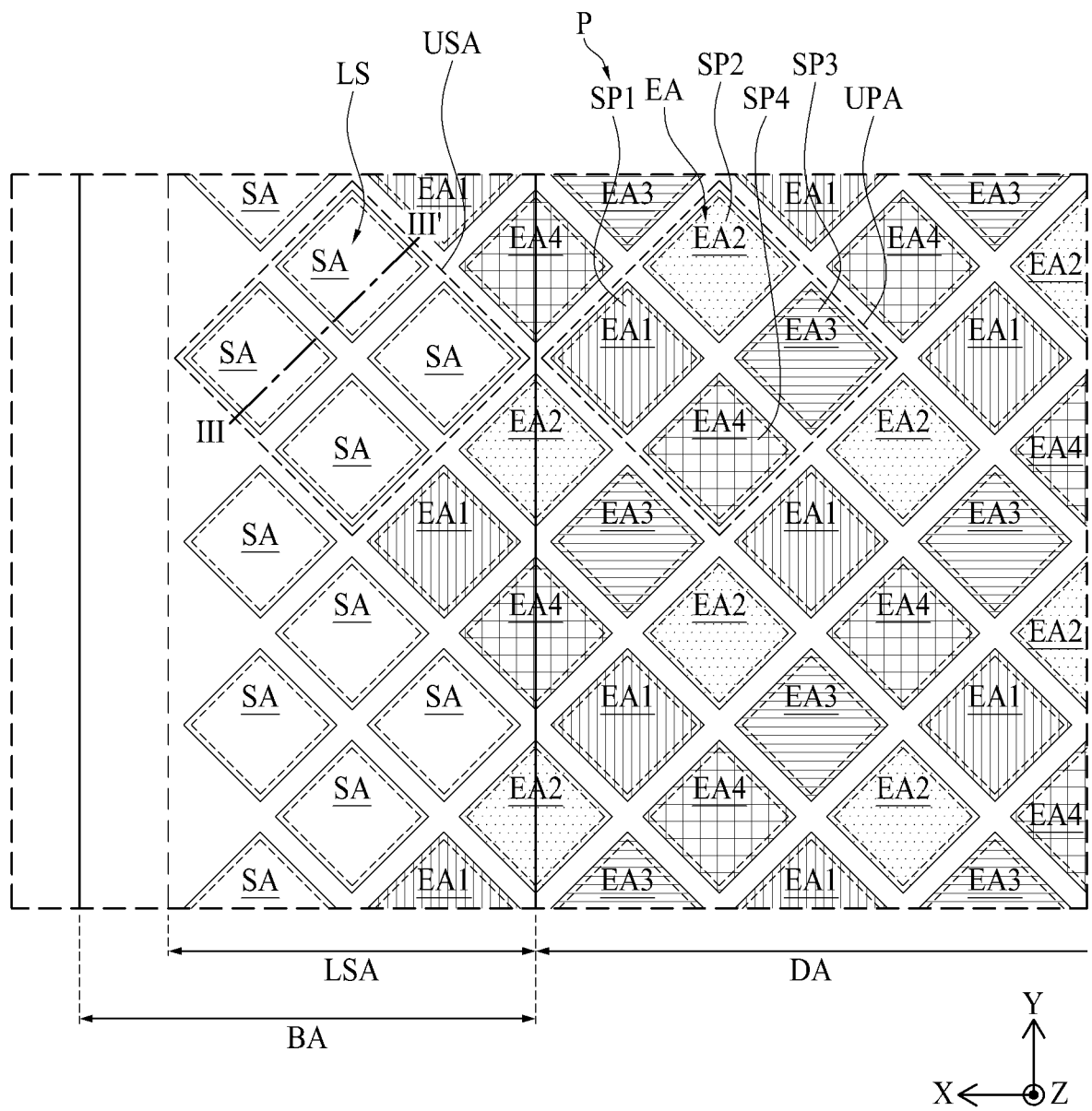
FIG. 12 is a view illustrating an example of a pixel and a light sensor, which are provided in a bezel area of FIG. 11.
Figure 13:
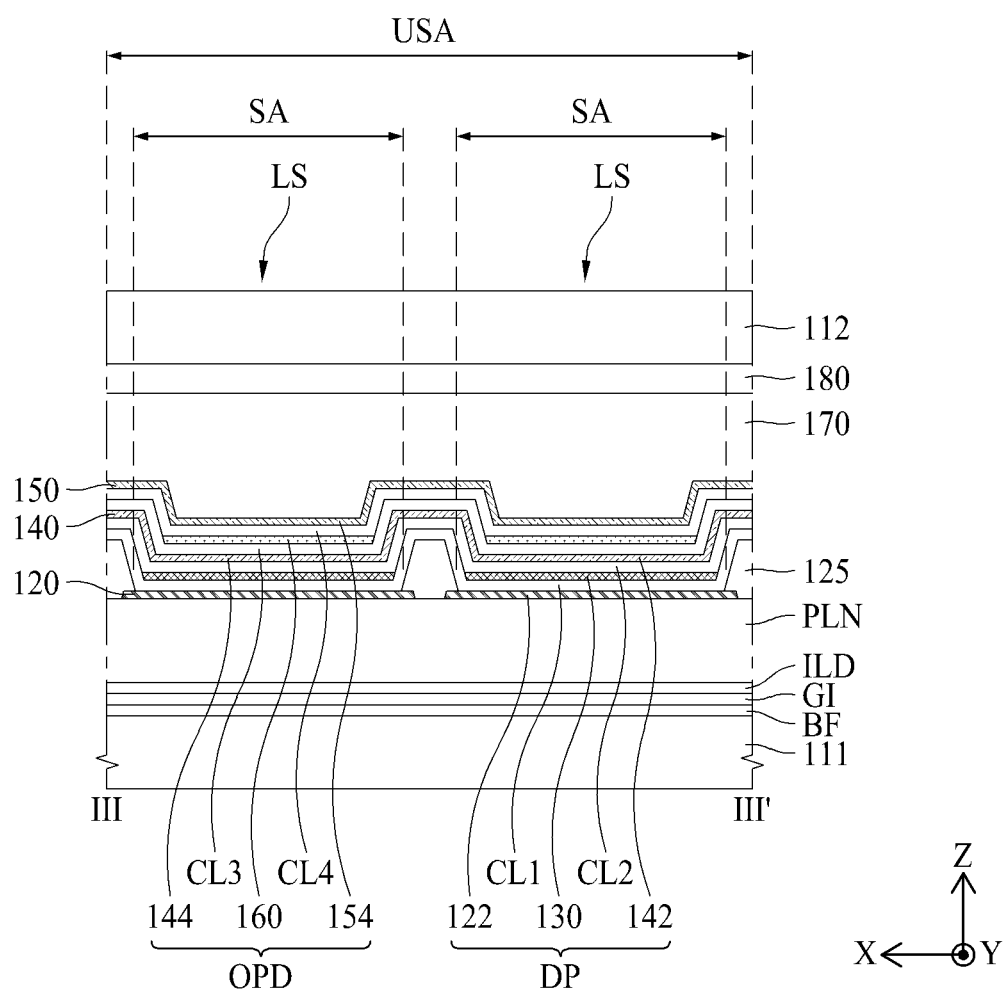
FIG. 13 is a cross-sectional view taken along line III-III' of FIG. 12.

FIG. 11 is a schematic plan view illustrating a display device according to other embodiment of the present disclosure, FIG. 12 is a view illustrating an example of a pixel and a light sensor, which are provided in a bezel area of FIG. 11, and FIG. 13 is a cross-sectional view taken along line III-III' of FIG. 12.

Referring to FIGS. 11 to 13, the display panel 100 according to other embodiment of the present disclosure is different from the display panel 100 shown in FIGS. 1 to 10 in that the light sensor area LSA is disposed in the bezel area BA. Hereinafter, the differences from FIGS. 1 to 10 will be described in detail, and a redundant description will be omitted.

In the display panel 100 according to other embodiment of the present disclosure, the light sensor area LSA may be disposed in the bezel area BA, particularly an area in which a plurality of dummy pixels are provided. The display panel 100 may include a plurality of dummy pixels DP provided in the bezel area BA. The plurality of dummy pixels DP has the same configuration as that of the pixel P although the light emitting layer 130 does not emit light, and may be disposed in a position adjacent to the display area DA in the bezel area BA.

The display panel 100 according to other embodiment of the present disclosure may be provided such that the plurality of light sensors LS of the light sensor area LSA overlap the plurality of dummy pixels DP. In detail, each of the plurality of dummy pixels DP may be provided in the bezel area BA over the first substrate 111. Each of the plurality of dummy pixels DP may be formed in such a manner that a first anode electrode 122, a first common layer CL1, a light emitting layer 130, a second common layer CL2 and a first cathode electrode 142 are sequentially stacked over the first substrate 111. The first anode electrode 122 may not be connected to the driving transistor T, unlike the pixels P of the display area DA. Since the first anode electrode 122 is not connected to the driving transistor T, the plurality of dummy pixels DP may not emit light even though the light emitting layer 130 is provided. In FIG. 13, the plurality of dummy pixels DP are shown as including the light emitting layer 130, but is not limited thereto. The light emitting layer 130 may be omitted from the plurality of dummy pixels DP.

The plurality of light sensors LS may be provided over the plurality of dummy pixels DP in the bezel area BA. Each of the plurality of light sensors LS may be formed in such a manner that a second cathode electrode 144, a third common layer CL3, a light active layer 160, a fourth common layer CL4, and a second anode electrode 154 are sequentially stacked on the plurality of dummy pixels DP. The second cathode electrode 144 may be the same as the first cathode electrode 142 of the dummy pixel DP. That is, the plurality of light sensors LS and the plurality of dummy pixels DP may share the cathode electrode.

In the display panel 100 according to other embodiment of the present disclosure, the plurality of light sensors LS are disposed in the bezel area BA, whereby the light sensor area LSA may be formed without reducing the size of the display area DA.

Also, in the display panel 100 according to other embodiment of the present disclosure, the plurality of light sensors LS may be disposed to overlap the plurality of dummy pixels DP that are previously provided, whereby the light sensor area LSA may be formed without increasing the size of the bezel area BA.

According to the present disclosure, the following advantageous effects may be obtained.

In the present disclosure, as the light sensor is provided in the display panel, a separate hole for seating the light sensor may not be formed. Therefore, in the present disclosure, since external water, oxygen, etc., are not permeated into the side of the hole, the light emitting element may be prevented from being degraded, and reliability may be improved.

Also, in the present disclosure, the organic light sensor made of an organic photo diode may be applied instead of the inorganic semiconductor light sensor, whereby costs may be reduced, and weight may be reduced.

In addition, in the present disclosure, the notch area in which an image is not displayed may be removed, whereby the area in which the light sensors are disposed may not be recognized by a user. Furthermore, in the present disclosure, decrease of the size in the area, in which the image is displayed, by the light sensor may be minimized or reduced.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate having a unit pixel area and a unit light sensor area;
a first electrode over the substrate;
a second electrode over the first electrode;
a third electrode over the second electrode;
a light emitting layer in the unit pixel area and disposed between the first electrode and the second electrode; and
a light active layer disposed in the unit light sensor area between the second electrode and the third electrode.

2. The display device of claim 1, wherein the first electrode is not disposed in the unit light sensor area, and
wherein the second electrode and the third electrode are commonly disposed in the unit pixel area and the unit light sensor area.

3. The display device of claim 1, wherein the unit pixel area includes a plurality of subpixels in which the light emitting layer emits light when different voltages are applied to the first electrode and the second electrode.

4. The display device of claim 3, wherein the first electrode is an anode electrode, and the second electrode is a cathode electrode.

5. The display device of claim 1, further comprising:
a first common layer between the first electrode and the light emitting layer; and
a second common layer between the second electrode and the light emitting layer,
wherein the first common layer and the second common layer are disposed in the unit pixel area and the unit light sensor area.

6. The display device of claim 5, wherein the first common layer and the second common layer are spaced apart from each other with the light emitting layer interposed therebetween in the unit pixel area, and are in contact with each other in the entire unit light sensor area.

7. The display device of claim 1, wherein the unit light sensor area includes at least one light sensor in which electrons and holes are separated from each other when light is incident on the light active layer from the outside, the holes are transferred to the second electrode, and the electrons are transferred to the third electrode, and
wherein the second electrode is a cathode electrode, and the third electrode is an anode electrode.

8. The display device of claim 1, wherein the light active layer is made of a material having a Perovskite structure.

9. The display device of claim 1, further comprising:
a third common layer disposed between the second electrode and the light active layer; and
a fourth common layer disposed between the third electrode and the light active layer,
wherein the third common layer and the fourth common layer are disposed in the unit pixel area and the unit light sensor area.

10. The display device of claim 9, wherein the third common layer and the fourth common layer are spaced apart from each other with the light active layer interposed therebetween in the unit light sensor area, and are in contact with each other in the entire unit pixel area.

11. The display device of claim 1, wherein the substrate includes a display area in which an image is displayed and a bezel area disposed adjacent the display area, and the unit light sensor area is included in at least one of the display area or the bezel area.

12. The display device of claim 11, wherein the display area includes:
a first display area in which a first plurality of unit pixel areas are disposed adjacent to each other; and
a second display area in which each of a plurality of unit light sensor areas is disposed between at least two of a second plurality of unit pixel areas.

13. The display device of claim 11, further comprising a light sensor area in which a plurality of unit light sensor areas are disposed to be adjacent to each other,
wherein the bezel area includes a plurality of dummy pixels, and the light sensor area is provided to overlap the plurality of dummy pixels in the bezel area.

14. The display device of claim 11, further comprising a light sensor area in which a plurality of unit light sensor areas are disposed to be adjacent to each other,
   wherein the light sensor area is provided to be adjacent the display area between the display area and the bezel area.

15. A display device comprising:
   a substrate having a plurality of unit pixel areas and a plurality of unit light sensor areas;
   a plurality of light emitting diodes disposed in the plurality of unit pixel areas, and including a first anode electrode, a light emitting layer, and a first cathode electrode; and
   a plurality of organic photo diodes provided in the plurality of unit light sensor areas, and including a second anode electrode, a light active layer, and a second cathode electrode,
   wherein the first cathode electrode of the plurality of light emitting diodes and the second cathode electrode of the plurality of organic photo diodes are provided on the same layer.

16. The display device of claim 15, wherein the first cathode electrode of the plurality of light emitting diodes and the second cathode electrode of the plurality of organic photo diodes are connected to each other.

17. The display device of claim 15, wherein the first anode electrode is provided below the first cathode electrode, and the second anode electrode is provided over the second cathode electrode.

18. The display device of claim 15, wherein each of the plurality of light emitting diodes further includes:
   a first common layer disposed between the first anode electrode and the light emitting layer; and
   a second common layer disposed between the first cathode electrode and the light emitting layer, and
   the first common layer and the second common layer are below the second cathode electrode in the plurality of unit light sensor areas.

19. The display device of claim 15, wherein each of the plurality of organic photo diodes further includes:
   a third common layer disposed between the second cathode electrode and the light active layer; and
   a fourth common layer disposed between the second anode electrode and the light active layer, and
   the third common layer and the fourth common layer are over the first cathode electrode in the plurality of unit pixel areas.

20. The display device of claim 15, wherein each of the plurality of unit pixel areas includes a plurality of subpixels, each of the plurality of unit light sensor areas includes at least one light sensor, and each of the plurality of organic photo diodes does not overlap the plurality of light emitting diodes.

* * * * *